(12) United States Patent
Jeong et al.

(10) Patent No.: US 7,994,510 B2
(45) Date of Patent: Aug. 9, 2011

(54) THIN FILM TRANSISTOR, METHOD OF MANUFACTURING THE SAME AND FLAT PANEL DISPLAY DEVICE HAVING THE SAME

(75) Inventors: Jong-Han Jeong, Suwon-si (KR);
Kwang-Suk Kim, Suwon-si (KR);
Jae-Kyeong Jeong, Suwon-si (KR);
Hui-Won Yang, Suwon-si (KR);
Yeon-Gon Mo, Suwon-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 209 days.

(21) Appl. No.: 12/318,856

(22) Filed: Jan. 9, 2009

(65) Prior Publication Data
US 2009/0294772 A1   Dec. 3, 2009

(30) Foreign Application Priority Data

May 30, 2008   (KR) ................ 10-2008-0050802

(51) Int. Cl.
*H01L 27/14* (2006.01)
*H01L 21/20* (2006.01)
(52) U.S. Cl. ............... 257/72; 257/E27.111; 438/479
(58) Field of Classification Search .......... 257/43, 257/49, 52, 57, 59, 66, 72, 213, 288, 347, 257/352, 353, 354, E27.001, E27.009, E27.111, 257/E27.112, E27.113, E21.4, E21.409, E21.411, 257/E21.415, E21.416; 438/478–509
See application file for complete search history.

(56) References Cited

U.S. PATENT DOCUMENTS

| | | | |
|---|---|---|---|
| 5,610,737 A * | 3/1997 | Akiyama et al. | ........ 349/47 |
| 5,767,530 A | 6/1998 | Ha | |
| 6,727,522 B1 | 4/2004 | Kawasaki et al. | |
| 6,849,872 B1 | 2/2005 | Yamazaki et al. | |
| 7,211,825 B2 | 5/2007 | Shih et al | |
| 2004/0023432 A1 | 2/2004 | Haga | |
| 2004/0155270 A1 | 8/2004 | Hoffman | |

(Continued)

FOREIGN PATENT DOCUMENTS

EP   1 209 748   5/2002

(Continued)

OTHER PUBLICATIONS

Korean Office Action dated Sep. 11, 2009 corresponding to the Korean priority application No. 20080050802.

(Continued)

*Primary Examiner* — Minh-Loan T Tran
*Assistant Examiner* — Kevin Quinto
(74) *Attorney, Agent, or Firm* — Robert E. Bushnell, Esq.

(57) ABSTRACT

A thin film transistor is provided having an oxide semiconductor as an active layer, a method of manufacturing the thin film transistor and a flat panel display device having the thin film transistor. The thin film transistor includes: a gate electrode formed on a substrate; an oxide semiconductor layer isolated from the gate electrode by a gate insulating layer and including channel, source and drain regions; source and drain electrodes coupled to the source and drain regions, respectively; and an ohmic contact layer interposed between the source and drain regions and the source and drain electrodes. In the TFT, the ohmic contact layer is formed with the oxide semiconductor layer having a carrier concentration higher than those of the source and drain regions.

14 Claims, 6 Drawing Sheets

U.S. PATENT DOCUMENTS

| | | |
|---|---|---|
| 2005/0067953 A1* | 3/2005 | Yamazaki et al. ............ 313/506 |
| 2005/0104134 A1 | 5/2005 | Kato |
| 2006/0043377 A1 | 3/2006 | Hoffman et al. |
| 2006/0124924 A1* | 6/2006 | Suh et al. ..................... 257/40 |
| 2006/0290852 A1* | 12/2006 | Yum ............................. 349/114 |
| 2007/0052025 A1 | 3/2007 | Yabuta |
| 2007/0069209 A1* | 3/2007 | Jeong et al. .................... 257/57 |
| 2008/0035920 A1* | 2/2008 | Takechi et al. ................. 257/43 |

FOREIGN PATENT DOCUMENTS

| | | |
|---|---|---|
| JP | 09-283767 | 10/1997 |
| JP | 2004-014982 | 1/2004 |
| JP | 2006-269469 | 10/2006 |
| KR | 10-2004-0106576 | 12/2004 |
| KR | 1020070035373 A | 3/2007 |
| KR | 10-2007-0044316 | 4/2007 |
| KR | 10-2007-0070719 | 7/2007 |
| KR | 1020070102969 A | 10/2007 |
| WO | 99/50911 | 10/1999 |
| WO | 00/59027 | 10/2000 |

OTHER PUBLICATIONS

Search Report from the EPO issued in the corresponding European Patent Application No. 06254999.3 dated Apr. 22, 2008, which was cited in the Information Disclosure Statement filed on Jun. 20, 2008 of the related U.S. Appl. No. 11/527,330.

S.M. Sze: "Physics of Semiconductor Physics" 1982, John Wiley & Sons, INC., USA 537622, XP002475755, which was cited in the Information Disclosure Statement filed on Jun. 20, 2008 of the related U.S. Appl. No. 11/527,330.

Korean Notice of Allowance corresponding to Korean Patent Application No. 2005-0090134 issued on Nov. 28, 2007, which was cited in the Information Disclosure Statement filed on Feb. 27, 2008 of the related U.S. Appl. No. 11/527,330.

* cited by examiner

THIN FILM TRANSISTOR, METHOD OF MANUFACTURING THE SAME AND FLAT PANEL DISPLAY DEVICE HAVING THE SAME

CLAIM OF PRIORITY

This application makes reference to, incorporates the same herein, and claims all benefits accruing under 35 U.S.C. §119 from an application for THIN FILM TRANSISTOR, METHOD OF MANUFACTURING THE THIN FILM TRANSISTOR AND FLAT PANEL DISPLAY DEVICE HAVING THE THIN FILM TRANSISTOR earlier filed in the Korean Intellectual Property Office on May 30, 2008 and there duly assigned Serial No. 10-2008-0050802.

BACKGROUND OF THE INVENTION

1. Field of the Invention

The present invention relates to a thin film transistor, a method of manufacturing the same and a flat panel display device having the same, and more particularly, to a thin film transistor having an oxide semiconductor as an active layer, a method of manufacturing the same and a flat panel display device having the same.

2. Discussion of Related Art

In general, a thin film transistor (TFT) includes an active layer providing channel, source and drain regions, and a gate electrode formed on the channel region and electrically insulated from the active layer by a gate insulating layer.

The active layer of the TFT described above is generally formed of a semiconductor material such as amorphous silicon or poly-silicon. At this time, if the active layer is formed of amorphous silicon, mobility is low, so that it is difficult to realize a driving circuit operating at a high speed. If the active layer is formed of poly-silicon, mobility is high while a threshold voltage is not uniform. Therefore, a separate compensation circuit should be added.

A conventional method of manufacturing a TFT using low temperature poly-silicon (LTPS) involves a high-cost process such as laser heat treatment, and is not easy to control characteristics. Therefore, it is difficult to apply the conventional method to a large-sized substrate.

In order to solve such a problem, studies on an oxide semiconductor used as an active layer have recently been conducted.

A TFT using a zinc oxide (ZnO) or oxide semiconductor containing ZnO as a main component as an active layer has been disclosed in Japanese Patent Publication No. 2004-273614.

An oxide semiconductor containing ZnO as a main component is estimated to be an amorphous and stable material. If such an oxide semiconductor is used as an active layer, a TFT can be manufactured using a conventional LTPS process, which can be performed at a low temperature of 300° C. or less.

However, in order to apply the oxide semiconductor containing ZnO as a main component to a device, it is required to develop a process satisfying electrical characteristics and improve characteristics in general. In addition, it is difficult to form an ohmic contact between a source/drain region and a metal electrode.

The above information disclosed in this Background section is only for enhancement of understanding of the background of the invention and therefore it may contain information that does not form the prior art that is already known to a person of ordinary skill in the art.

SUMMARY OF THE INVENTION

Accordingly, it is an object of the present invention to provide a TFT in which an ohmic contact is formed between an oxide semiconductor layer and a metal electrode, a method of manufacturing the same, and a flat panel display device having the same.

It is another object of the present invention to provide a TFT in which an ohmic contact layer is formed without adding a mask and a process, a method of manufacturing the same and a flat panel display device having the same.

According to an aspect of the present invention, the present invention provides a thin film transistor (TFT), which includes: a substrate; a gate electrode formed on the substrate; an oxide semiconductor layer isolated from the gate electrode by a gate insulating layer and including channel, source and drain regions; source and drain electrodes coupled to the source and drain regions, respectively; and an ohmic contact layer interposed between the source and drain regions and the source and drain electrodes, wherein the ohmic contact layer is formed with the oxide semiconductor layer having a carrier concentration higher than those of the source and drain regions.

According to another aspect of the present invention, the present invention provides a method of manufacturing a TFT, which includes: forming a gate electrode on a substrate; forming a gate insulating layer on the substrate having the gate electrode; forming an oxide semiconductor layer including channel, source and drain regions on the gate insulating layer so that an ohmic contact layer having a carrier concentration higher than those of the source and drain regions is formed on a surface of the oxide semiconductor layer; forming source and drain electrodes respectively coupled to the source and drain regions through the ohmic contact layer; and removing the ohmic contact layer interposed between the source and drain electrodes.

According to still another aspect of the present invention, the present invention provides a flat panel display device having a TFT, which includes: a first substrate having a plurality of pixels defined by a plurality of first and second conductive lines, a TFT controlling a signal supplied to each of the pixels, and a first electrode coupled to the TFT; a second substrate having a second electrode; and a liquid crystal layer injected into a sealed space between the first and second electrodes, wherein the TFT includes: a gate electrode formed on the first substrate; an oxide semiconductor layer isolated from the gate electrode by a gate insulating layer and including channel, source and drain regions; source and drain electrodes coupled to the source and drain regions, respectively; and an ohmic contact layer interposed between the source and drain regions and the source and drain electrodes, wherein the ohmic contact layer is formed with the oxide semiconductor layer having a carrier concentration higher than those of the source and drain regions.

According to still another aspect of the present invention, the present invention provides a flat panel display device having a TFT, which includes: a first substrate having an organic light emitting device including a first electrode, an organic thin film layer and a second electrode, and a TFT controlling an operation of the organic light emitting device; and a second substrate disposed opposite to the first substrate, wherein the TFT includes: a gate electrode formed on the first substrate; an oxide semiconductor layer isolated from the gate electrode by a gate insulating layer and including channel, source and drain regions; source and drain electrodes coupled to the source and drain regions, respectively; and an ohmic contact layer interposed between the source and drain regions and the source and drain electrodes, wherein the ohmic contact layer is formed with the oxide semiconductor layer having a carrier concentration higher than those of the source and drain regions.

The contact resistance of a silicon (Si) semiconductor and a metal electrode is in inverse proportion to the carrier concentration of the silicon semiconductor. Therefore, in a process of manufacturing a TFT having the silicon semiconductor as an active layer, the depletion width of the semiconductor layer is decreased by doping an ion of a high concentration, so that carriers can easily pass through an energy barrier. However, if a doping method is used, the number of masks and processes is increased, and therefore, manufacturing costs may be increased. Recently, a process of manufacturing a TFT using an oxide semiconductor as an active layer has been developed, but a method of forming an ohmic contact between an oxide semiconductor layer and a metal electrode have not been proposed yet.

According to the present invention, in a process of forming an oxide semiconductor layer, oxygen partial pressure is increased, or plasma treatment is performed with respect to a surface of the oxide semiconductor layer, thereby forming an ohmic contact layer having a high carrier concentration on the surface of the oxide semiconductor layer. Since the ohmic contact layer is formed by controlling the carrier concentration using a relatively simple method, the number of masks and processes can be decreased, and electrical characteristics of a device can be improved by a low-resistance ohmic contact.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF PREFERRED EMBODIMENTS

Figure 1:
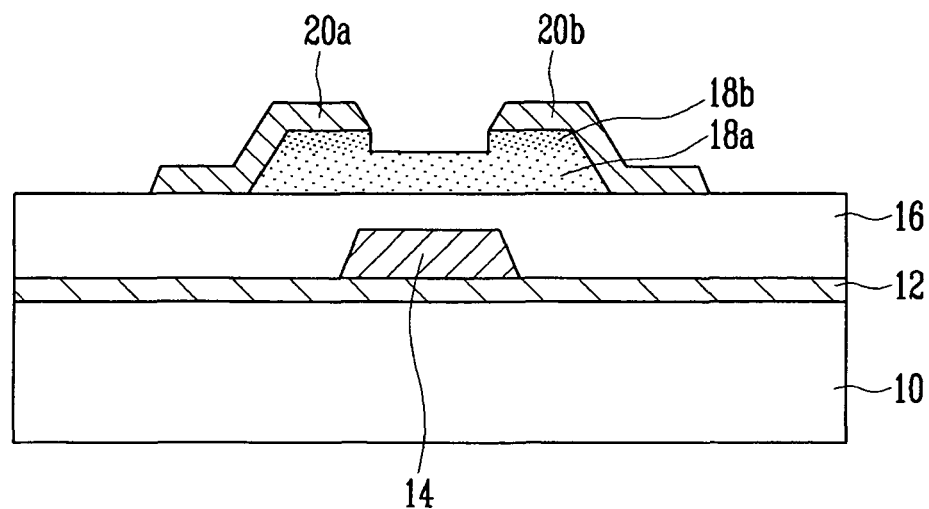
FIG. 1 is a cross-sectional view of a thin film transistor (TFT) showing according to the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. In addition, when an element is referred to as being "on" another element, it can be directly on the element or be indirectly on the another element with one or more intervening elements interposed therebetween. Also, when an element is referred to as being "connected to" another element, it can be directly connected to the element or be indirectly connected to the element with one or more intervening elements interposed therebetween. Hereinafter, like reference numerals refer to like elements.

FIG. 1 is a cross-sectional view of a thin film transistor (TFT) showing according to the present invention.

A buffer layer 12 is formed on a substrate 10 formed of an insulating material, and a gate electrode 14 is formed on the buffer layer 12. An oxide semiconductor layer 18a is formed above the substrate 10 having the gate electrode 14. The oxide semiconductor layer 18a is electrically isolated from the gate electrode 14 by a gate insulating layer 16 and provides channel, source and drain regions. An ohmic contact layer 18b is interposed between the oxide semiconductor layer 18a of the source and drain regions and source and drain electrodes 20a and 20b.

The oxide semiconductor layer 18a and the ohmic contact layer 18b may be formed of a semiconductor material containing zinc oxide (ZnO) as a main component, or InZnO (IZO), GaInZO (GIZO) or the like, which is formed by doping at least one ion of indium (In), gallium (Ga) and stannum (Sn) into the semiconductor material containing ZnO as a main component. At this time, the ohmic contact layer 18b has a carrier concentration higher than the oxide semiconductor layer 18a of the source and drain regions so as to form an ohmic contact between the oxide semiconductor layer 18a of the source and drain regions and the source and drain electrodes 20a and 20b. For example, the oxide semiconductor layer 18a has a carrier concentration of 1e+13 to 1e+17 atoms/cm$^3$, and the ohmic contact layer 18b has a carrier concentration of 1e+19 to 1e+21 atoms/cm$^3$.

FIGS. 2A to 2E are cross-sectional views illustrating a method of fabricating the TFT according to the present invention. The TFT of the present invention will be described in detail through the following manufacturing process.

Figure 2A:
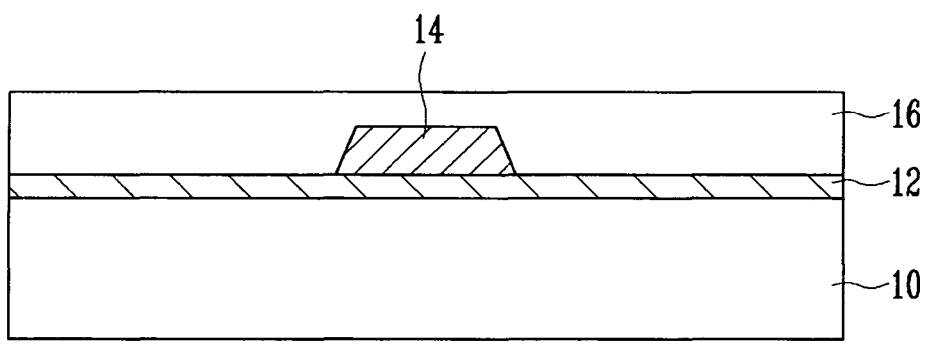
FIGS. 2A to 2E are cross-sectional views illustrating a method of fabricating the TFT according to the present invention.

Referring to FIG. 2A, a buffer layer 12 is formed on a substrate 10 made of an insulating material. A gate electrode 14 is formed on the buffer layer 12, and a gate insulating layer 16 is formed above the substrate 10 having the gate electrode 14. The gate electrode 14 is formed of a metal such as Mo, MoW or Al, and the gate insulating layer 16 is formed of a silicon oxide layer (SiO$_2$) or silicon nitride layer (SiNx).

Figure 2B:
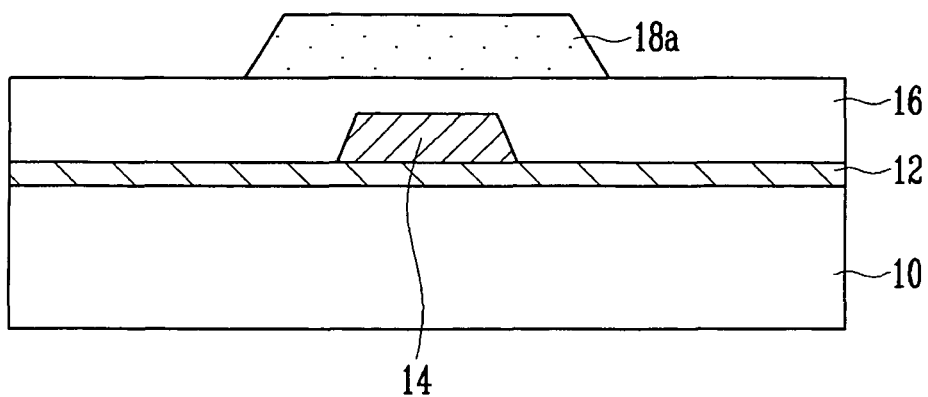

Referring to FIG. 2B, an oxide semiconductor layer 18a including channel, source and drain regions is formed on the gate insulating layer 16 to overlap with the gate electrode 14. The oxide semiconductor layer 18a is formed of a semiconductor material containing zinc oxide (ZnO) as a main component, or InZnO (IZO), GaInZO (GIZO) or the like, which is formed by doping at least one ion of indium (In), gallium (Ga) and stannum (Sn) into the semiconductor material containing ZnO as a main component.

In one embodiment, a GIZO layer may be formed using a co-sputtering method using two or more targets or a pulse laser deposition method. GaInZnO, InZnO, Ga$_2$O$_3$ or the like is used as the target, and ions including In, Ga and Zn are deposited from the target, thereby forming a GIZO layer having a carrier concentration of about 1e+13 to 1e+17 atoms/cm$^3$. At this time, the carrier concentration may be controlled by a percentage of oxygen occupying the GIZO layer, i.e., oxygen partial pressure. At this time, if the carrier concentration is controlled to have 1e+17 atoms/cm$^3$ or more, mobility increases while leakage current occurs in an off-state due to the decrease of specific resistivity.

Figure 3:
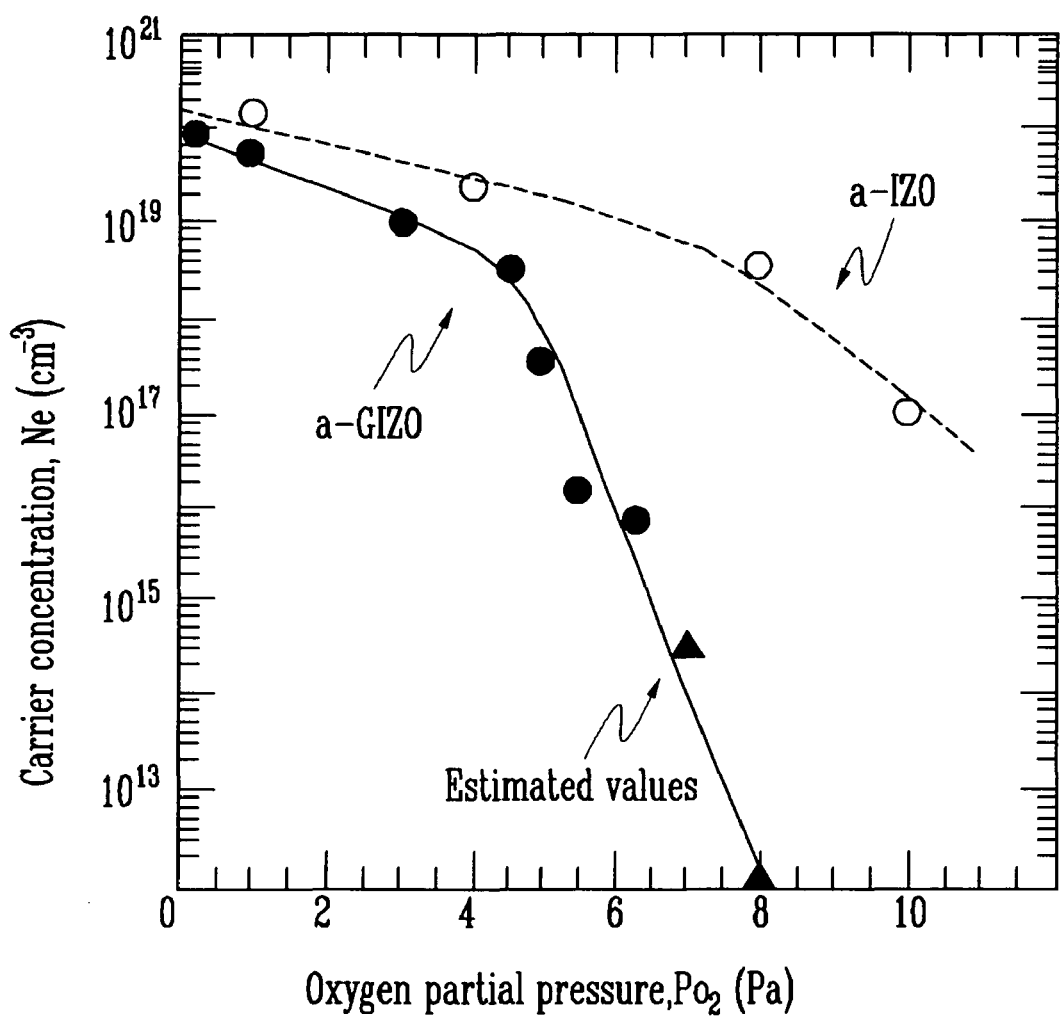
FIG. 3 is a graph showing a change in carrier concentration of an oxide semiconductor layer depending on an oxygen partial pressure.

FIG. 3 is a graph showing a change in carrier concentration of an oxide semiconductor layer depending on an oxygen partial pressure. The oxygen partial pressure is controlled to be, for example, 30 to 90% in a deposition process, thereby forming an amorphous oxide semiconductor layer (IZO or GIZO) having a carrier concentration of 1e+13 to 1e+17 atoms/cm$^3$. The change in carrier concentration depending on an oxygen partial pressure may refer to the paper (H. Hosono, "Non-crystalline solids", 2006).

Figure 2C:
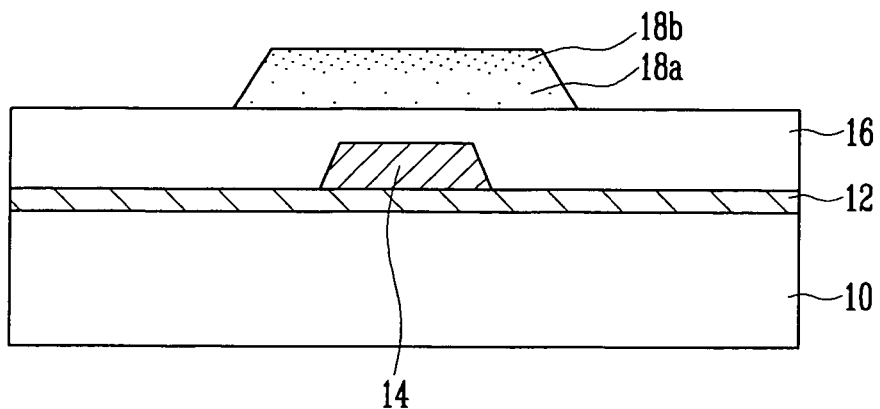

Referring to FIG. 2C, an ohmic contact layer 18b having a carrier concentration higher than that of the oxide semiconductor layer 18a of the source and drain regions is formed on a surface of the oxide semiconductor layer 18a.

In one embodiment, the ohmic contact layer 18b may be simultaneously formed with the oxide semiconductor layer 18a. In the process of forming the oxide semiconductor layer 18a a shown in FIG. 2B, the oxygen partial pressure is decreased, thereby forming the ohmic contact layer 18b having a carrier concentration higher than that of the oxide semiconductor layer 18a of the source and drain regions.

If the oxygen partial pressure is increased, the content of oxygen atoms ($O_2$) in a thin film is increased by reactive sputtering. Since one oxygen atom is coupled with two electrons in the thin film, the carrier concentration is decreased. Therefore, the oxygen partial pressure is decreased using such a principle, thereby increasing the carrier concentration. The semiconductor characteristic of GIZO may be changed into the conductor characteristic of GIZO by controlling the carrier concentration of GIZO, or the carrier concentration of GIZO may be changed depending on the depth of GIZO.

Figure 2D:
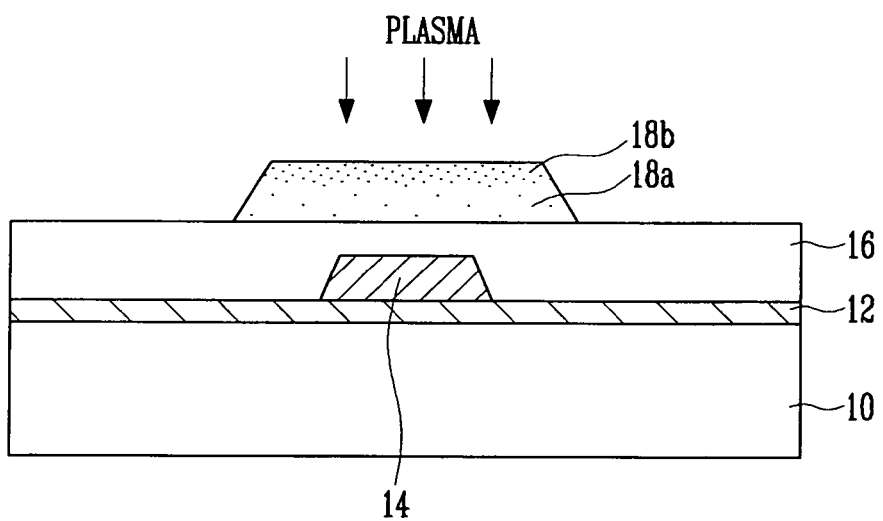

In another embodiment, the oxide semiconductor layer 18a is formed, and the ohmic contact layer 18b is then formed. After the oxide semiconductor layer 18a is formed as shown in FIG. 2B, the ohmic contact layer 18b is formed by performing plasma treatment with respect to the surface of the oxide semiconductor layer 18a as shown in FIG. 2D.

If the surface of the oxide semiconductor layer 18a is exposed to plasma such as argon (Ar), surface lattice is broken. Accordingly, oxygen deficiency occurs to increase the carrier concentration, thereby forming the ohmic contact layer 18b of a conductor characteristic having a carrier concentration of about 1e+19 to 1e+21 atoms/cm$^3$.

Figure 2E:
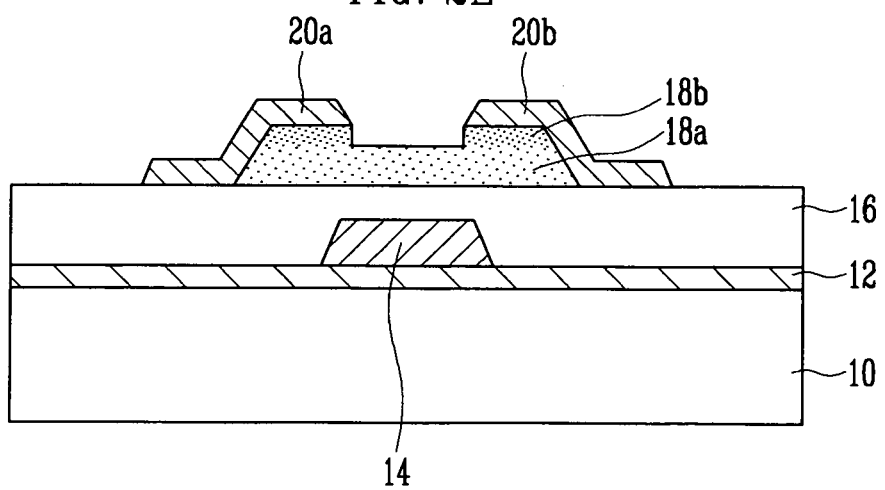

Referring to FIG. 2E, a conductive layer is formed with a metal such as Mo, MoW, Al, AlAd, or AlLiLa on the entire surface of the substrate 10 and then patterned, thereby forming source and drain electrodes 20a and 20b connected to the oxide semiconductor layer 18a of the source drain regions through the ohmic contact layer 18b. Then, the ohmic contact layer 18b exposed between the source and drain electrodes 20a and 20b is removed. The ohmic contact layer 18b exposed between the source and drain electrodes 20a and 20b may be removed through over-etching in an etching process for patterning the source and drain electrodes 20a and 20b. If the ohmic contact layer 18b exposed as described above is removed through over-etching, the number of masks and processes can be decreased.

The TFT of the present invention may be applied to a flat panel display device such as a liquid crystal display device or an organic light emitting display device.

Figure 4:
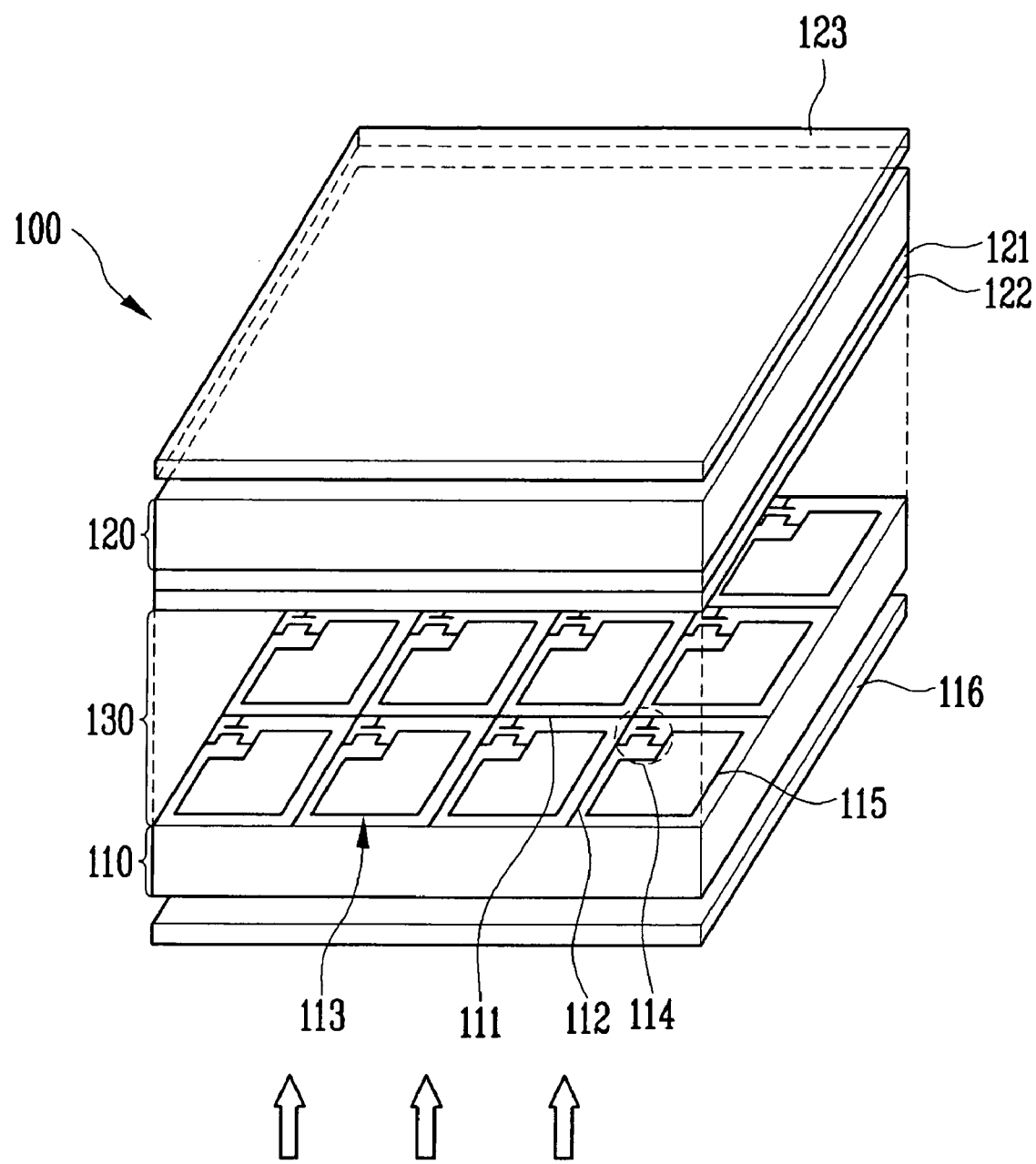
FIG. 4 is a perspective view showing an embodiment of a flat panel display device having the TFT according to the present invention.

FIG. 4 is a perspective view showing an embodiment of a flat panel display device having the TFT according to the present invention. A display panel 100 displaying images will be schematically described.

The display panel 100 includes two substrates 110 and 120 disposed opposite to each other, and a liquid crystal layer 130 interposed between the two substrates 110 and 120. Pixel regions 113 are defined by a plurality of gate and data lines 111 and 112 arranged in a matrix form. A TFT 114 controlling a signal supplied to each pixel and a pixel electrode 115 coupled to the transistor 114 are formed at each intersection portion of the gate and data lines 111 and 112 on the substrate 110.

The TFT 114 has a structure shown in FIG. 1, and may be manufactured using the manufacturing method described with reference to FIGS. 2A to 2E.

A color filter 121 and a common electrode 122 are formed on the substrate 120. Polarizing plates 116 and 123 are formed at rear surfaces of the substrates 110 and 120, respectively, and a backlight (not shown) is disposed below the polarizing plate 116.

Meanwhile, an LCD drive IC (not shown) driving the display panel 100 is mounted at a side of the pixel regions 113 of the display panel 100. The LCD drive IC converts electric signals provided from the outside of the display panel 100 into scan and data signals, and then supplies the converted scan and data signals to the gate and data lines 111 and 112.

Figure 5A:
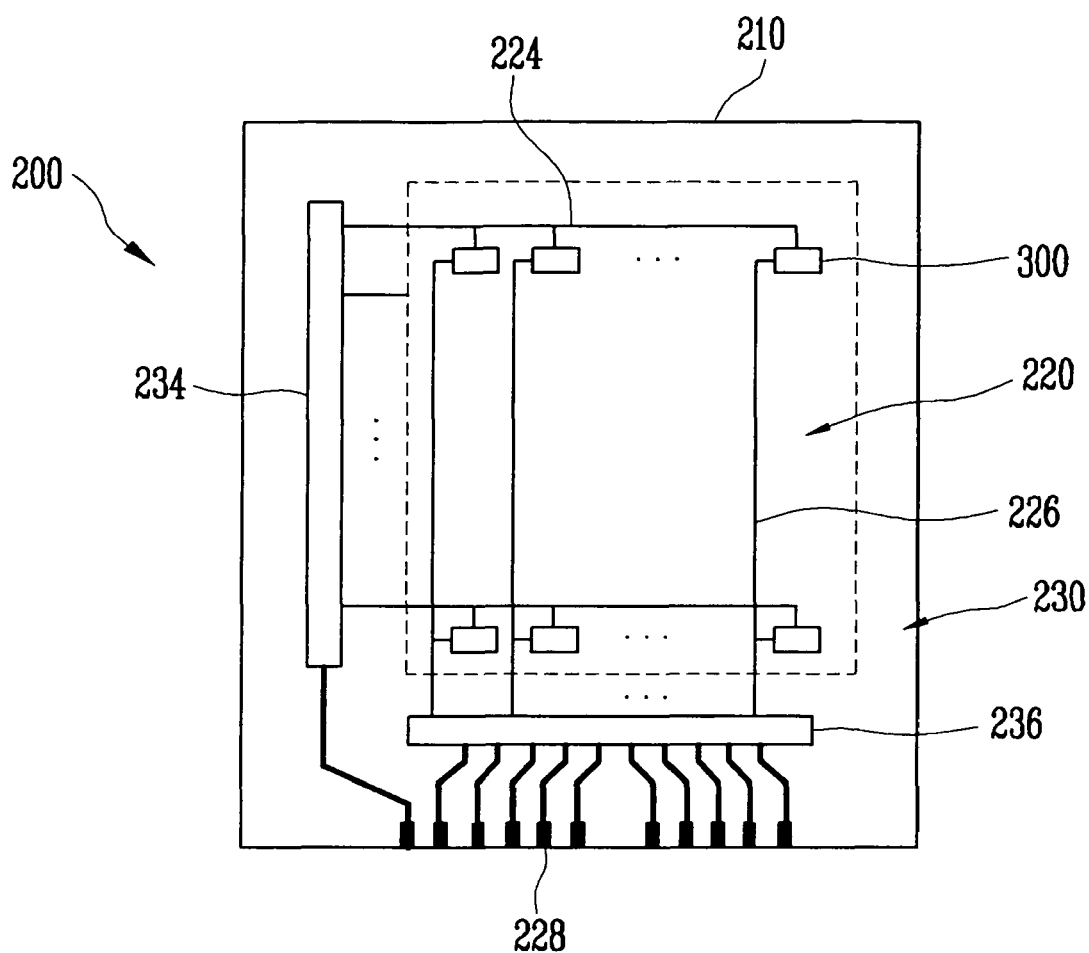
FIGS. 5A and 5B are respectively plan and cross-sectional views showing another embodiment of a flat panel display device having a TFT according to the present invention.
Figure 5B:
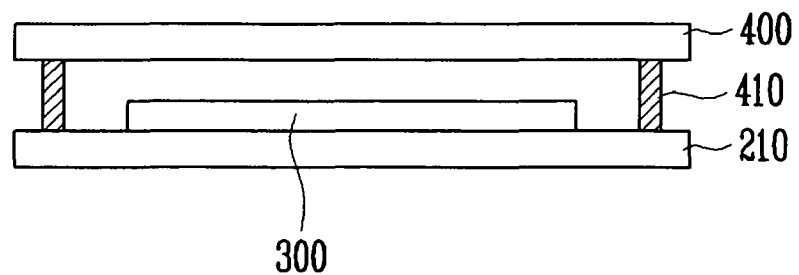

FIGS. 5A and 5B are respectively plan and cross-sectional views showing another embodiment of a flat panel display device having a TFT according to the present invention. A display panel 200 displaying images will be schematically described.

Referring to FIG. 5A, a substrate 210 is divided into a pixel region 220 and a non-pixel region 230 surrounding the pixel region 220. A plurality of organic light emitting devices 300 connected in a matrix form between scan and data lines 224 and 226 are formed on the substrate 210 of the pixel region 220. On the substrate 210 of the non-pixel region 230 are formed the scan and data lines 224 and 226 extended from the pixel region 220, a power supply line (not shown) operating the organic light emitting devices 300, and scan and data drivers 234 and 236 respectively supplying signals provided from the outside of the display panel 200 to the scan and data lines 224 and 226.

Figure 6:
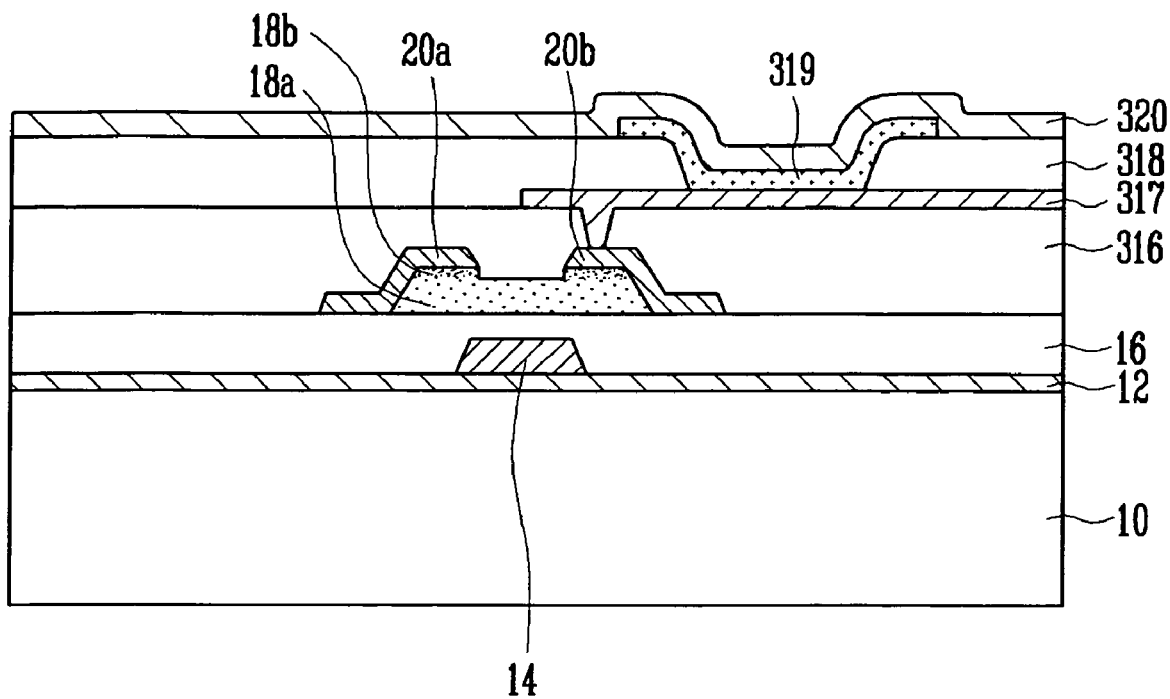
FIG. 6 is a cross-sectional view of an organic light emitting element of FIG. 5A.

Referring to FIG. 6, the organic light emitting device 300 includes an anode electrode 317, a cathode electrode 320 and an organic thin film layer 319 formed between the anode and cathode electrodes 317 and 320. The organic thin film layer 319 is formed into a structure in which a hole transfer layer, an organic light emitting layer and an electron transfer layer are laminated. A hole injection layer and an electron injection layer may be further included in the organic thin film layer 319. The organic light emitting device 300 may further include a TFT controlling an operation of the organic light emitting device 300 and a capacitor maintaining signals.

The TFT has a structure shown in FIG. 1, and may be manufactured using the manufacturing method described with reference to FIGS. 2A to 2E.

Hereinafter, the organic light emitting element 300 including the TFT configured as described above will be described in detail with reference to FIGS. 5A and 6.

A buffer layer 12 is formed on a substrate 210, and a gate electrode 14 is formed on the buffer layer 12 of a pixel region 220. At this time, a scan line 224 coupled to the gate electrode 14 is formed in the pixel region 220. The scan line 224 extended from the pixel region and a pad 228 receiving signals provided from the outside may be formed in a non-pixel region 230.

An oxide semiconductor layer 18a electrically isolated from the gate electrode 14 by a gate insulating layer 16 and providing channel, source and drain regions is formed above the substrate 210 having the gate electrode 14, and an ohmic contact layer 18b is formed in the source and drain regions of the oxide semiconductor layer 18a. The oxide semiconductor layer 18a and the ohmic contact layer 18b are formed of a semiconductor material containing zinc oxide (ZnO) as a main component, or InZnO (IZO), GaInZO (GIZO) or the like, which is formed by doping at least one ion of indium (In), gallium (Ga) and stannum (Sn) into the semiconductor material containing ZnO as a main component. At this time, the ohmic contact layer 18b has a carrier concentration higher than the oxide semiconductor layer 18a of the source and drain regions so as to form an ohmic contact between the oxide semiconductor layer 18a of the source and drain regions and the source and drain electrodes 20a and 20b. For example, the oxide semiconductor layer 18a has a carrier concentration of 1e+13 to 1e+17 atoms/cm$^3$, and the ohmic contact layer 18b has a carrier concentration of 1e+19 to 1e+21 atoms/cm$^3$.

Source and drain electrodes 20a and 20b are formed to be coupled to the oxide semiconductor layer 18a of the source and drain regions through the ohmic contact layer 18b. At this time, a data line 226 coupled to the source and drain electrodes 20a and 20b is formed in the pixel region 220, and the data line 226 extended from the pixel region 220 and the pad 228 receiving signals provided from the outside are formed in the non-pixel region.

A planarization layer 316 is formed above the substrate 210 having the source and drain electrodes 20a and 20b. A via hole through which the source or drain electrode 20a or 20b is exposed and an anode electrode 317 coupled to the source or drain electrode 20a or 20b through the via hole are formed in the planarization layer 316.

A pixel defining layer 318 is formed on the planarization layer 316 so that a region (light emitting region) of the anode electrode 317 is exposed.

Referring to FIG. 5B, a sealing substrate 400 sealing the pixel region 220 is disposed above the substrate 210 having the organic light emitting device 300, and the sealing substrate 400 is joined with the substrate 210 by a sealing member 410, thereby completing the display panel 200.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A thin film transistor (TFT), comprising:
a substrate;
a gate electrode formed on the substrate;
an oxide semiconductor layer isolated from the gate electrode by a gate insulating layer and including channel, source and drain regions;
source and drain electrodes coupled to the source and drain regions, respectively; and
an ohmic contact layer interposed between the source and drain regions and the source and drain electrodes,
the ohmic contact layer being formed with the oxide semiconductor layer having a carrier concentration higher than those of the source and drain regions,
wherein the carrier concentration of the oxide semiconductor layer is 1e+13 to 1e+17 atoms/cm$^3$, and the carrier concentration of the ohmic contact layer is 1e+19 to 1e+21 atoms/cm$^3$.

2. The TFT as claimed in claim 1, wherein the oxide semiconductor layer and the ohmic contact layer comprise zinc oxide ZnO) as a main component.

3. The TFT as claimed in claim 2, wherein the oxide semiconductor layer and the ohmic contact layer are doped with at least one ion of indium (In), gallium (Ga) and stannum (Sn).

4. A method of manufacturing a TFT, comprising:
forming a gate electrode on a substrate;
forming a gate insulating layer on the substrate having the gate electrode;
forming an oxide semiconductor layer including channel, source and drain regions on the gate insulating layer so that an ohmic contact layer having a carrier concentration higher than those of the source and drain regions is formed on a surface of the oxide semiconductor layer;
forming source and drain electrodes respectively coupled to the source and drain regions through the ohmic contact layer; and
removing the ohmic contact layer interposed between the source and drain electrodes,
wherein the carrier concentration of the oxide semiconductor layer is 1e+13 to 1e+17 atoms/cm$^3$, and the carrier concentration of the ohmic contact layer is 1e+19 to 1e+21 atoms/cm$^3$.

5. The method as claimed in claim 4, wherein the ohmic contact layer is formed by decreasing oxygen partial pressure in the process of forming the oxide semiconductor layer.

6. The method as claimed in claim 4, wherein the ohmic contact layer is formed by performing plasma treatment with respect to the surface of the oxide semiconductor layer.

7. The method as claimed in claim 4, wherein the oxide semiconductor layer is formed of zinc oxide (ZnO).

8. The method as claimed in claim 7, wherein at least one ion of indium (In), gallium (Ga) and stannum (Sn) is doped into the oxide semiconductor layer.

9. A flat panel display device having a TFT, comprising:
a first substrate having a plurality of pixels defined by a plurality of first and second conductive lines, a TFT controlling a signal supplied to each of the pixels, and a first electrode coupled to the TFT;
a second substrate having a second electrode; and
a liquid crystal layer injected into a sealed space between the first and second electrodes, the TFT comprising:
a gate electrode formed on the first substrate;
an oxide semiconductor layer isolated from the gate electrode by a gate insulating layer and including channel, source and drain regions;
source and drain electrodes coupled to the source and drain regions, respectively; and
an ohmic contact layer interposed between the source and drain regions and the source and drain electrodes,
the ohmic contact layer being formed with the oxide semiconductor layer having a carrier concentration higher than those of the source and drain regions,
wherein the carrier concentration of the oxide semiconductor layer is 1e+13 to 1e+17 atoms/cm$^3$, and the carrier concentration of the ohmic contact layer is 1e+19 to 1e+21 atoms/cm$^3$.

10. The flat panel display device as claimed in claim 9, wherein the oxide semiconductor layer and the ohmic contact layer comprise zinc oxide (ZnO) as a main component.

11. The flat panel display device as claimed in claim 10, wherein the oxide semiconductor layer and the ohmic contact layer are doped with at least one ion of indium (In), gallium (Ga) and stannum (Sn).

12. A flat panel display device having a TFT, comprising:
a first substrate having an organic light emitting device including a first electrode, an organic thin film layer and a second electrode, and a TFT controlling an operation of the organic light emitting device; and a second substrate disposed opposite to the first substrate, the TFT comprising:
a gate electrode formed on the first substrate;
an oxide semiconductor layer isolated from the gate electrode by a gate insulating layer and including channel, source and drain regions;
source and drain electrodes coupled to the source and drain regions, respectively; and
an ohmic contact layer interposed between the source and drain regions and the source and drain electrodes,
the ohmic contact layer being formed with the oxide semiconductor layer having a carrier concentration higher than those of the source and drain regions,
wherein the carrier concentration of the oxide semiconductor layer is 1e+13 to 1e+17 atoms/cm$^3$, and the carrier concentration of the ohmic contact layer is 1e+19 to 1e+21 atoms/cm$^3$.

13. The flat panel display device as claimed in claim 12, wherein the oxide semiconductor layer and the ohmic contact layer comprise zinc oxide (ZnO) as a main component.

14. The flat panel display device as claimed in claim 13, wherein the oxide semiconductor layer and the ohmic contact layer are doped with at least one ion of indium (In), gallium (Ga) and stannum (Sn).

* * * * *